US010763419B2

United States Patent
Kirby et al.

(10) Patent No.: US 10,763,419 B2
(45) Date of Patent: Sep. 1, 2020

(54) DEPOSITION METHODOLOGY FOR SUPERCONDUCTOR INTERCONNECTS

(71) Applicants: Christopher F. Kirby, Gambrills, MD (US); Vivien M. Luu, Linthicum, MD (US); Michael Rennie, Ashland, VA (US); Sean R. McLaughlin, Severn, MD (US)

(72) Inventors: Christopher F. Kirby, Gambrills, MD (US); Vivien M. Luu, Linthicum, MD (US); Michael Rennie, Ashland, VA (US); Sean R. McLaughlin, Severn, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/612,326

(22) Filed: Jun. 2, 2017

(65) Prior Publication Data
US 2018/0351072 A1    Dec. 6, 2018

(51) Int. Cl.
*H01L 39/24* (2006.01)
*H01L 21/02* (2006.01)
(Continued)

(52) U.S. Cl.
CPC .... *H01L 39/2406* (2013.01); *H01L 21/02063* (2013.01); *H01L 21/2855* (2013.01);
(Continued)

(58) Field of Classification Search
CPC .......... H01L 39/2406; H01L 21/7684; H01L 23/5226; H01L 21/76879; H01L 21/02063;
(Continued)

(56) References Cited

U.S. PATENT DOCUMENTS 4,960,751 A    10/1990  Yamazaki
5,055,158 A    10/1991  Gallagher et al.
(Continued)

FOREIGN PATENT DOCUMENTS

EP    1076110 A1    2/2001
EP    3387681 A1    10/2018
(Continued)

OTHER PUBLICATIONS

International Search Report and Written Opinion corresponding to International Application No. US/PCT2018/033299 dated Mar. 6, 2019.
(Continued)

*Primary Examiner* — Latanya N Crawford Eason
*Assistant Examiner* — Latanya N Crawford
(74) *Attorney, Agent, or Firm* — Tarolli, Sundheim, Covell & Tummino LLP

(57) ABSTRACT

A method of forming a superconductor interconnect structure is disclosed. The method includes forming a dielectric layer overlying a substrate, forming an interconnect opening in the dielectric layer, and moving the substrate to a deposition chamber. The method further includes depositing a superconducting metal in the interconnect opening, by performing a series of superconducting deposition and cooling processes to maintain a chamber temperature at or below a predetermined temperature until the superconducting metal has a desired thickness, to form a superconducting element in the superconductor interconnect structure.

18 Claims, 5 Drawing Sheets

(51) Int. Cl.
*H01L 21/768* (2006.01)
*H01L 23/522* (2006.01)
*H01L 23/532* (2006.01)
*H01L 21/285* (2006.01)

(52) U.S. Cl.
CPC .... *H01L 21/7684* (2013.01); *H01L 21/76877* (2013.01); *H01L 21/76879* (2013.01); *H01L 21/76891* (2013.01); *H01L 23/5226* (2013.01); *H01L 23/53285* (2013.01); *H01L 39/2445* (2013.01); *H01L 21/76807* (2013.01); *H01L 21/76814* (2013.01)

(58) Field of Classification Search
CPC ......... H01L 21/76814; H01L 23/53285; H01L 21/76807; H01L 21/76891
See application file for complete search history.

(56) References Cited

U.S. PATENT DOCUMENTS

| | | |
|---|---|---|
| 5,600,101 A | 2/1997 | Sakai |
| 5,818,071 A | 10/1998 | Loboda et al. |
| 6,184,477 B1 | 2/2001 | Tanahashis |
| 6,265,353 B1 * | 7/2001 | Kinder .................. C23C 14/22 118/723 EB |
| 6,280,201 B1 | 8/2001 | Morris |
| 6,344,616 B1 | 2/2002 | Yokokawa |
| 6,365,518 B1 | 4/2002 | Lee et al. |
| 6,378,757 B1 | 4/2002 | Holcombe |
| 6,482,656 B1 | 11/2002 | Lopatin |
| 6,534,394 B1 * | 3/2003 | Cooney, III ........ H01L 21/2855 257/E21.169 |
| 7,659,197 B1 * | 2/2010 | Juliano ............... H01L 21/2855 204/298.01 |
| 7,776,748 B2 * | 8/2010 | Brcka ............... H01J 37/32935 216/37 |
| 8,241,701 B2 | 8/2012 | Dordi et al. |
| 8,298,936 B1 * | 10/2012 | Rozbicki ........... H01L 21/76862 438/637 |
| 9,653,398 B1 | 5/2017 | Kelliher et al. |
| 2003/0203614 A1 | 10/2003 | Rajagopalan et al. |
| 2004/0005775 A1 | 1/2004 | Chou et al. |
| 2004/0168636 A1 * | 9/2004 | Savvides ................. C30B 29/16 118/723 CB |
| 2005/0006222 A1 * | 1/2005 | Ding ..................... C23C 14/358 204/192.1 |
| 2005/0239300 A1 | 10/2005 | Yasumura et al. |
| 2006/0024951 A1 | 2/2006 | Schuehrer et al. |
| 2006/0273446 A1 | 12/2006 | Sato et al. |
| 2007/0059923 A1 | 3/2007 | Lee et al. |
| 2007/0184656 A1 | 8/2007 | Sherman et al. |
| 2007/0193982 A1 * | 8/2007 | Brown .................. C23C 14/046 219/121.43 |
| 2008/0081482 A1 * | 4/2008 | Brcka ............... H01J 37/32935 438/714 |
| 2008/0311711 A1 * | 12/2008 | Hampp ............... H01L 21/2855 438/197 |
| 2009/0183984 A1 | 7/2009 | Sakuma et al. |
| 2011/0089405 A1 * | 4/2011 | Ladizinsky ............ B82Y 10/00 257/31 |
| 2011/0147941 A1 * | 6/2011 | Muta ................ H01L 21/76898 257/770 |
| 2011/0241765 A1 | 10/2011 | Pesetski et al. |
| 2014/0027274 A1 * | 1/2014 | Godet ................. H01J 37/3467 204/298.06 |
| 2015/0119252 A1 * | 4/2015 | Ladizinsky ............ B82Y 10/00 505/170 |
| 2015/0179914 A1 * | 6/2015 | Greer ................ H01L 23/53285 505/470 |
| 2015/0179918 A1 | 6/2015 | Greer et al. |
| 2015/0236235 A1 | 8/2015 | Ladizinsky et al. |
| 2015/0371847 A1 * | 12/2015 | Cheng ................. C23C 14/0641 204/192.25 |
| 2018/0053689 A1 | 2/2018 | Kirby et al. |
| 2018/0151430 A1 | 5/2018 | Kirby et al. |

FOREIGN PATENT DOCUMENTS

| | | |
|---|---|---|
| JP | S61233691 A | 10/1986 |
| JP | S6281075 A | 4/1987 |
| JP | S63130792 A | 6/1988 |
| JP | 64-064274 A | 12/1988 |
| JP | H10150228 A | 6/1998 |
| JP | 3190289 B2 | 7/2001 |
| JP | 2002043640 A | 2/2002 |
| JP | 2002299705 A | 10/2002 |
| JP | 2004232054 A | 8/2004 |
| JP | 2005039244 A | 2/2005 |
| JP | 2008532271 A | 8/2008 |
| JP | 2009111306 A | 5/2009 |
| JP | 2009278125 A | 11/2009 |
| JP | 2011164068 A | 8/2011 |
| JP | 2012519379 A | 8/2012 |
| JP | 2015511067 A | 4/2015 |
| JP | 6334231 B2 | 5/2018 |
| KR | 20000026669 A | 5/2000 |
| KR | 1020010072404 B1 | 7/2001 |
| KR | 1020070102211 A | 10/2007 |
| WO | 2003079429 A1 | 9/2003 |
| WO | 2017066553 A1 | 6/2017 |
| WO | 2018075117 A2 | 4/2018 |

OTHER PUBLICATIONS

Australian Examination Report corresponding to Australian Patent No. 2016365632, pp. 1-4, dated May 3, 2019.
International Preliminary Report on Patentability corresponding to International Application No. PCT/US2017/050520, pp. 1-10, dated Apr. 4, 2019.
United States Office Action corresponding to U.S. Appl. No. 15/351,755, pp. 1-8, dated Jun. 26, 2019.
Japanese Office Action for Application No. 2018-527930 dated Jul. 23, 2019.
Australian Examination Report for Application No. 2017345050 dated Jul. 20, 2019.
Australian Examination Report for Application No. 2017345049 dated Aug. 5, 2019.
Australian Examination Report for Application No. 2017358595 dated Aug. 6, 2019.
Canadian Office Action corresponding to Canadian Patent Application No. 3006284 dated Mar. 21, 2019.
Canadian Office Action and Search Report corresponding to Canadian Patent Application No. 3033652, pp. 1-5, dated Apr. 15, 2019.
Korean Office Action for Application No. 10-2018-7016289 dated Nov. 12, 2019.
Australian Examination Report for Application No. 2017345049 dated Dec. 19, 2019.
Australian Examination Report for Application No. 2017360504 dated Dec. 20, 2019.
International Preliminary Report on Patentability for Application No. PCT/US2018/031139 dated Nov. 28, 2019.
Ramzi, A, et al., "Niobium and Aluminum Josephson Junctions Fabricated with a Damascene CMP Process", Physics Procedia, vol. 36, pp. 211-216 (2012). DOI: 10.1016/j.phpro.2012-06-148.
International Search Report for International Application No. PCT/US2019/054551 dated Jan. 21, 2020.
Korean Notice of Preliminary Rejection for Korean Patent Application No. 10-2019-7014101 dated Apr. 13, 2020.
Korean Office Action for Application No. 10-2019-7007405 dated Mar. 6, 2020.
Japanese Office Action for Application No. 2019-521826 dated Mar. 10, 2020.
Japanese Office Action for Application No. 2019-508819 dated Mar. 3, 2020.

(56) References Cited

OTHER PUBLICATIONS

Korean Office Action for Application No. 10-2019-708632 dated Mar. 11, 2020.
Japanese Office Action for Patent Application No. 2019-520518 dated Apr. 13, 2020.
Tolpygo, et al. "Plasma process-induced damage to Josephons tunnel junctions in superconducting integrated circuits" Superconductor Science and Technology, vol. 20, No. 11, Oct. 18, 2007.
Australian Office Action for Application No. 2017366449 dated Jul. 6, 2020.
Australian Office Action for Application No. 2018270769 dated May 20, 2020.
Korean Office Action for Application No. 10-2019-7007376 dated May 15, 2020.
Canadian Office Action for Application No. 3,041,827 dated Jun. 16, 2020.
Japanese Office Action for Application No. 2019/508827 dated May 19, 2020.
Canadian Office Action for Application No. 3,033,343 dated Jun. 9, 2020.

* cited by examiner

DEPOSITION METHODOLOGY FOR SUPERCONDUCTOR INTERCONNECTS

GOVERNMENT INTEREST

The invention was made under US Contract Number 30069413. Therefore, the US Government has rights to the invention as specified in that contract.

TECHNICAL FIELD

The present invention relates generally to superconductors, and more particularly to a deposition methodology for superconductor interconnects.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. One such fabrication process for formation of conductive contacts and lines is known as a dual damascene process. Current dual damascene processes center around copper (Cu) interconnects for sub 130 nanometer (nm) integrated circuits (ICs). There is no known current process of filling a dual damascene structure with a superconducting metal using semiconductor deposition processes.

SUMMARY

In one example, a method of forming a superconductor interconnect structure is provided. The method comprises forming a dielectric layer overlying a substrate, forming an interconnect opening in the dielectric layer, and moving the substrate to a deposition chamber. The method further comprises depositing a superconducting metal in the interconnect opening, by performing a series of superconducting deposition and cooling processes to maintain a chamber temperature at or below a predetermined temperature until the superconducting metal has a desired thickness, to form a superconducting element in the superconductor interconnect structure.

In another example, a method of forming a superconductor dual damascene structure is provided. The method comprises forming a second dielectric layer over a first dielectric layer having a first superconducting element, etching a contact opening in the second dielectric layer that extends to and exposes the first superconducting element in the first dielectric layer, etching a conductive line opening in the second dielectric layer that overlies the contact opening to form a dual damascene structure having a dual damascene opening, and moving the dual damascene structure to reside on a temperature control chuck in a deposition chamber. The method further comprises setting the temperature to the temperature controlled chuck at or below a predetermined temperature, and depositing a superconducting metal in the dual damascene opening while in the deposition chamber to form a dual damascene structure comprised of a contact and a second conductive line overlying and coupled to the contact, such that the contact connects the first conductive line to the second conductive line through the second dielectric layer. The depositing the superconducting metal comprises performing a series of superconducting deposition and cooling processes to maintain a chamber temperature at or below the predetermined temperature until the superconducting metal has a desired thickness.

DETAILED DESCRIPTION

The present disclosure describes a method to fill an interconnect structure with a superconducting metal. Vias and trenches of the interconnect structure are filled with a deposition process that employs a series of deposition and cool step sequences to maintain temperatures at or below 150° C. In one example, the temperatures are maintained at or below 90° C. This is achieved by depositing the metal film, turning off the deposition power, of for example, a deposition chamber, and allowing the wafer to cool before the next deposition cycle occurs. This is repeated until the metal film is deposited to the appropriate thickness for forming contacts and/or conductive lines.

In one example, a method is provided to fill a dual damascene structure with a superconducting metal using a physical vapor deposition (PVD) deposition process. It has been demonstrated that a dual damascene dielectric structure can be filled successfully with little to no voids by performing the above series of deposition and cool step sequences using a PVD chamber.

In another example, the method utilizes a PVD tool that is capable of providing power to a superconducting material slab of about 5 kW (5,000 W) to about 30 kW (30,000 W) with AC bias assistance to the wafer in the range from about 100 W to about 500 W to sputter a superconducting film in a damascene structure. The film properties allow for superconducting properties below 30K within the damascene structure.

In yet another example, a superconducting material is sputtered due to the ionization of a gas molecule, such as Argon, which collides with a superconducting target and knocks off metal atoms from the target surface. The sputtering process is controlled by the process variables mentioned above. The process alters the direction of sputtered ionized metal atoms toward the substrate by the attraction to the biased substrate and having a coil with tunable deposition rate by applying AC power between about 0 to about 1500 W and DC power between about 0 to about 500 W. The tunable coil impacts the ionization rate of the metal which is then accelerated to the substrate, for example, at an angle between 45°-90°, such that the angular distribution of ionized metal atoms is controlled by the coil power.

Figure 1:
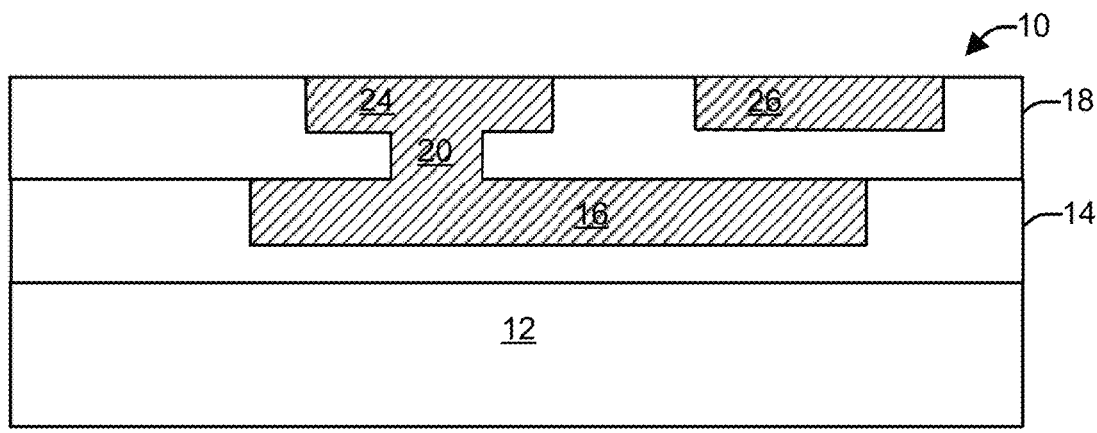
FIG. 1 illustrates a schematic cross-sectional view of a superconducting interconnect structure.

FIG. 1 illustrates cross-sectional view of a superconductor interconnect structure 10. The superconductor interconnect structure 10 includes a first dielectric layer 14 overlying a substrate 12, and a second dielectric layer 18 overlying the first dielectric layer 14. The substrate 12 can be formed of silicon, glass or other substrate material. Both the first and the second dielectric layers 14 and 18 can be formed of a low temperature dielectric material that can be employed in low temperatures (e.g., less than or equal to 150 degrees Celsius) typically utilized in the formation of superconducting devices. A first conductive line 16 is embedded in the first dielectric layer 14. A first conductive contact 20 extends from the first conductive line 16 at a first end to a second conductive line 24 in the second dielectric layer 18, and a second conductive contact 26 is disposed in the second dielectric layer 18 overlying a portion of the first conductive line 16. Each of the contacts and conductive lines are formed of a superconducting material, such as niobium. Each of the conductive lines and conductive contacts are formed with a deposition process that employs a series of deposition and cool step sequences to maintain temperatures at or below 150° C. (e.g., at or below 90° C.). This is achieved by depositing the metal film, turning off the power and allowing the wafer to cool before the next deposition cycle occurs. This is repeated until the metal film is deposited to the appropriate thickness.

Turning now to FIGS. 2-13, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. The present example will be illustrated with respect to a single damascene trench etched into a dielectric thin film to form a bottom conductive line followed by a dual damascene process to form top conductive lines.

Figure 2:
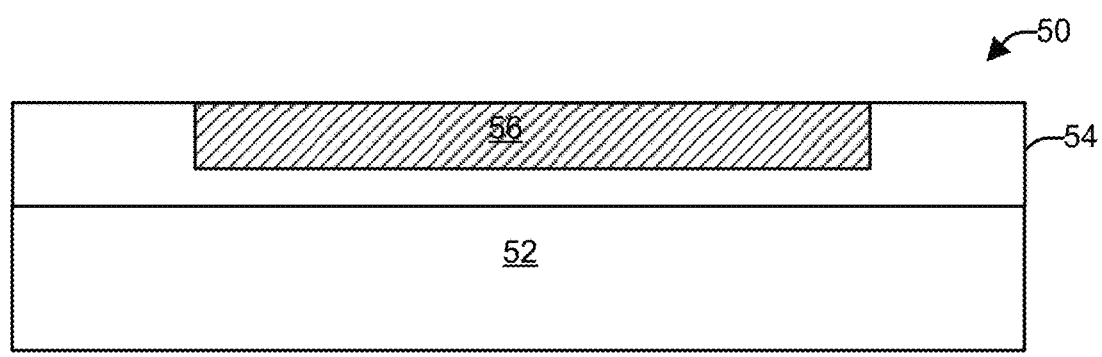
FIG. 2 illustrates a schematic cross-sectional view of an example of a superconductor structure in its early stages of fabrication.

FIG. 2 illustrates a cross-sectional view of a superconductor structure 50 in its early stages of fabrication. The superconductor structure 50 includes a first dielectric layer 54, that overlays an underlying substrate 52. The underlying substrate 52 can be, for example, a silicon or glass wafer that provides mechanical support for the first dielectric layer 54 and subsequent overlying layers. A first conductive line 56 resides within the first dielectric layer 54 and has a top surface that is flush with a top surface of the first dielectric layer 54. The first conductive line 56 is formed from a superconductive material and can be formed by a series of deposition and cool step sequences to maintain temperatures at or below 150° C. until the metal film is deposited to the appropriate thickness. In another example, a series of deposition and cool step sequences are performed to maintain temperatures at or below 90° C. until the metal film is deposited to the appropriate thickness.

A second dielectric layer 58 is formed over the first dielectric layer 54. Any suitable technique for forming the first and second dielectric layers may be employed such as Low Pressure Chemical Vapor Deposition (LPCVD), Plasma Enhanced Chemical Vapor Deposition (PECVD), High Density Plasma Chemical Vapor Deposition (HDP-CVD), sputtering or spin-on techniques to a thickness suitable for providing an interconnect layer.

Figure 3:
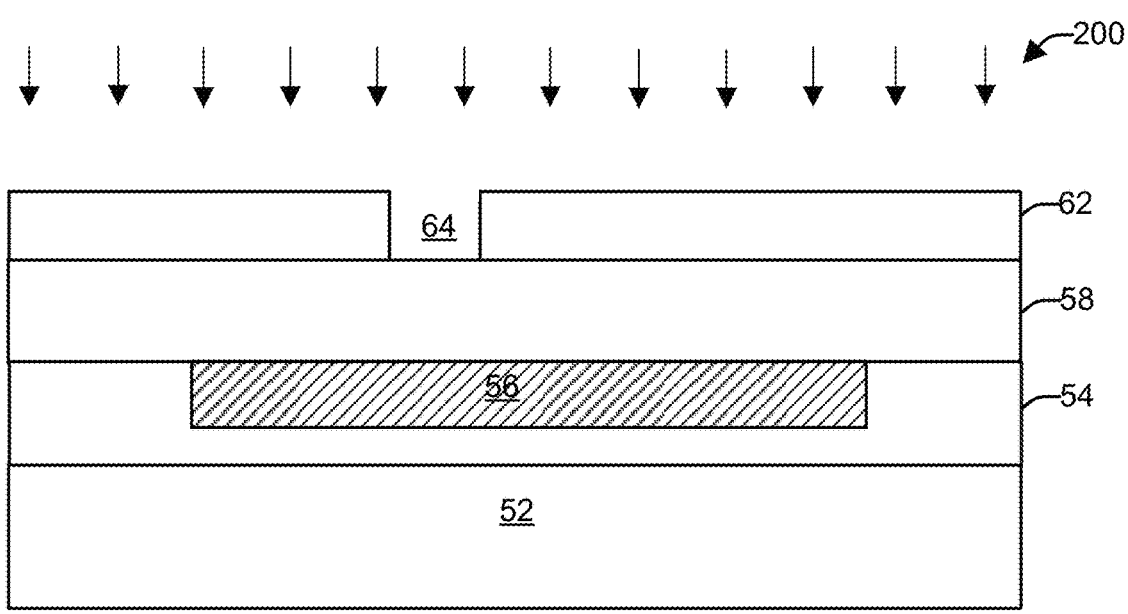
FIG. 3 illustrates a schematic cross-sectional view of a beginning formation of a first portion of the dual damascene process undergoing an etch process.

FIG. 3 illustrates a beginning formation of a first portion of the dual damascene process. As illustrated in FIG. 3, a photoresist material layer 62 has been applied to cover the structure and patterned and developed to expose via opening 64 in the photoresist material layer 62 in accordance with a via pattern. The photoresist material layer 62 can have a thickness that varies in correspondence with the wavelength of radiation used to pattern the photoresist material layer 62. The photoresist material layer 62 may be formed over the second dielectric layer 58 via spin-coating or spin casting deposition techniques, selectively irradiated (e.g., via deep ultraviolet (DUV) irradiation) and developed to form the via opening 64.

FIG. 3 also illustrates performing of an etch 200 (e.g., anisotropic reactive ion etching (RIE)) on the second dielectric layer 58 to form extended via opening 66 (FIG. 4) in the second dielectric layer 58 based on the via pattern in the photoresist material layer 62. The etch step 200 can be a dry etch and employ an etchant which selectively etches the underlying second dielectric layer 58 at a faster rate than the underlying conductive line 56 and the overlying photoresist material layer 62. For example, the second dielectric layer 58 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern on the photoresist material layer 62 to thereby create the extended via opening 66. The photoresist material layer 62 is thereafter stripped (e.g., ashing in an $O_2$ plasma) so as to result in the structure shown in FIG. 4.

Figure 4:
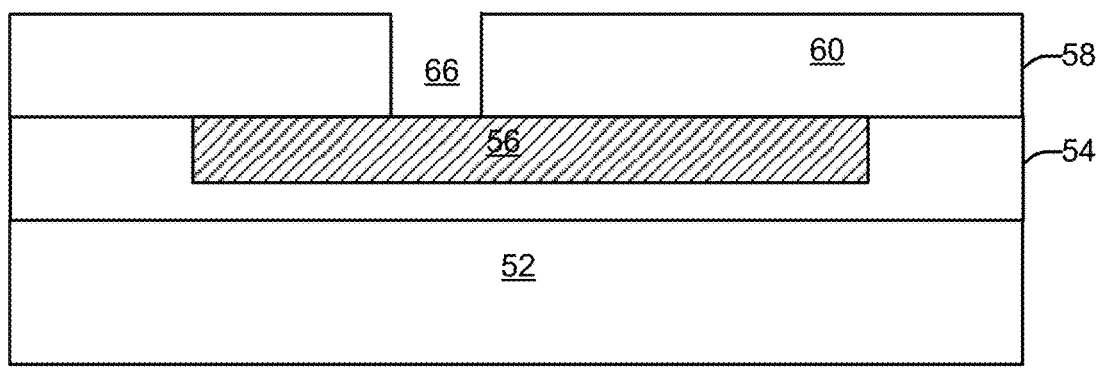
FIG. 4 illustrates a schematic cross-sectional view of the structure of FIG. 3 after the etch process and after the photoresist material layer has been stripped.
Figure 5:
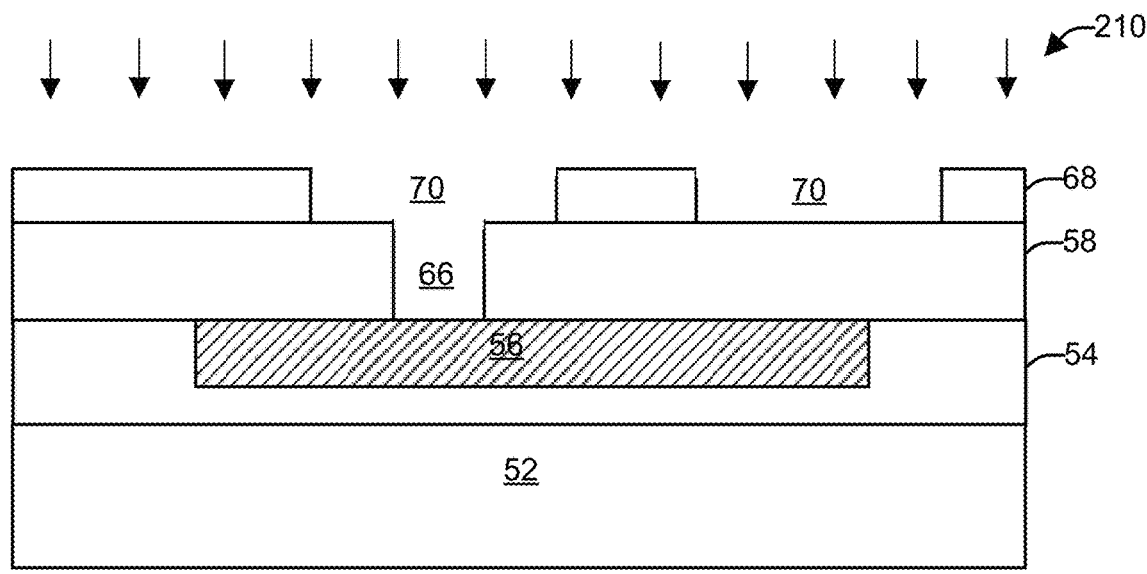
FIG. 5 illustrates a schematic cross-sectional view of a beginning formation of a second portion of the dual damascene process undergoing an etch process.
Figure 6:
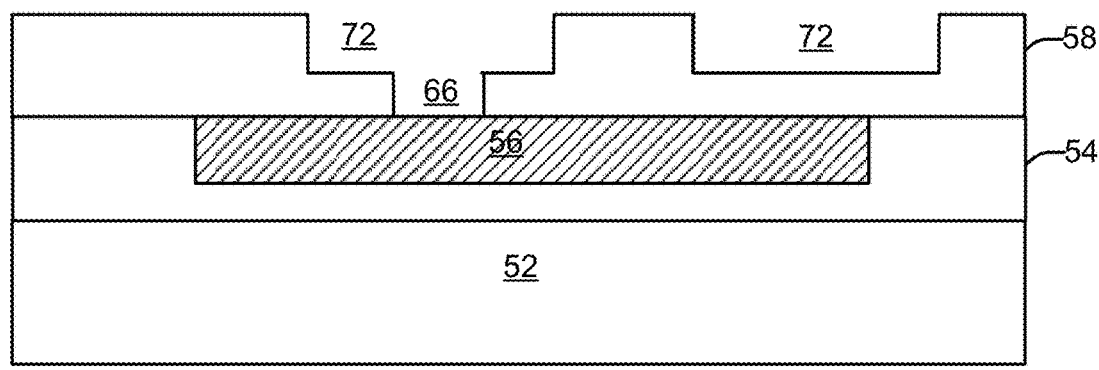
FIG. 6 illustrates a schematic cross-sectional view of the structure of FIG. 5 after the etch process and after the photoresist material layer has been stripped.
Figure 7:
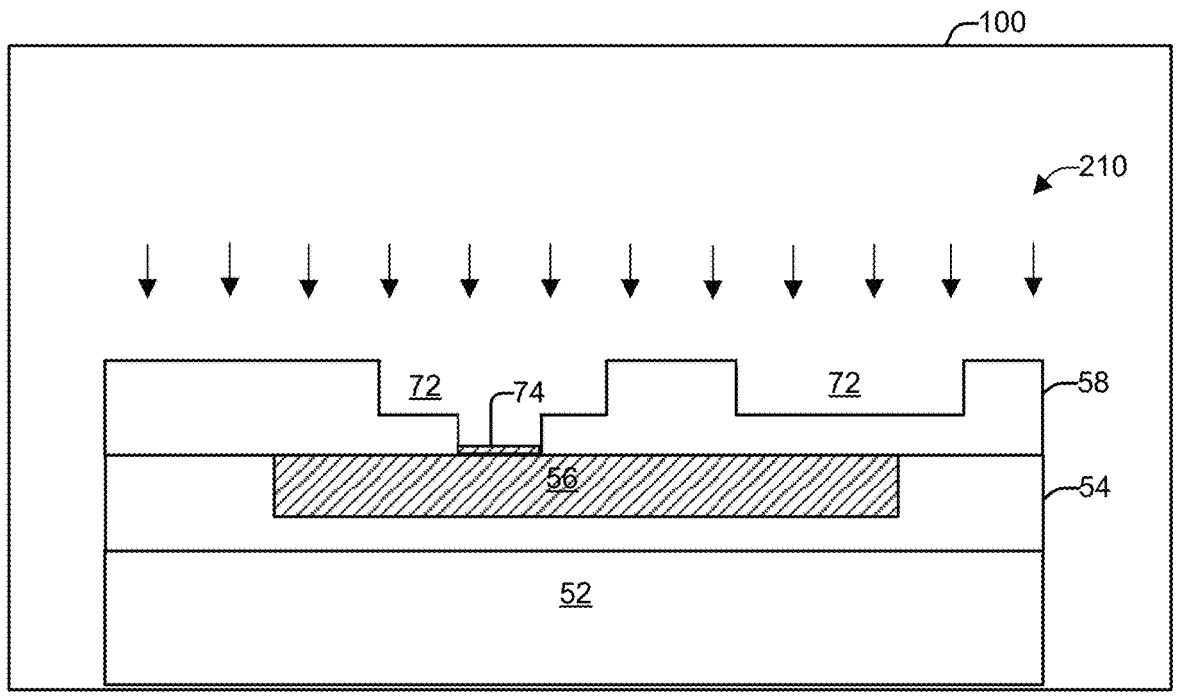
FIG. 7 illustrates a schematic cross-sectional view of the structure of FIG. 6 undergoing a preclean process.

As represented in FIG. 5, a photoresist material layer 68 is applied to cover the structure of FIG. 4, and is then patterned and developed to expose open trench regions 70 in the photoresist material layer 68 in accordance with a trench pattern. FIG. 5 also illustrates performing of an etch 210 (e.g., anisotropic reactive ion etching (RIE)) on the second dielectric layer 58 to form partially extended openings 72 (FIG. 6) based on the trench pattern in the photoresist material layer 68. The etch 210 also removes layers of niobium oxide and portions of dielectric oxide formed during the various processes and not covered by the photoresist material layer 68. The photoresist material layer 68 is thereafter stripped so as to result in the structure shown in FIG. 6. The extended opening 72 is co-aligned with the via opening 66 to form a dual damascene opening.

During the stripping of the photoresist material layer 68, and the transfer of the structure through one or more transfer/buffer chambers, oxides build up on the superconducting metal and on the second dielectric layer 58. This results in the formation of a metal-oxide 74, such as niobium oxide, on the top surface of the conductive line 56 degrading performance. This metal-oxide layer 74 has a deleterious effect on the superconducting properties of the first conductive line 56. Therefore, the structure is transferred to a preclean chamber to remove oxides from the superconducting metals prior to depositon. The oxides can be removed by peforming a sputter etch. The structure undergoes an etch process 210 to remove the metal-oxide 74, and portions of dielectric oxide (not shown) formed on the second dielectric layer 58.

Figures 8, 9:
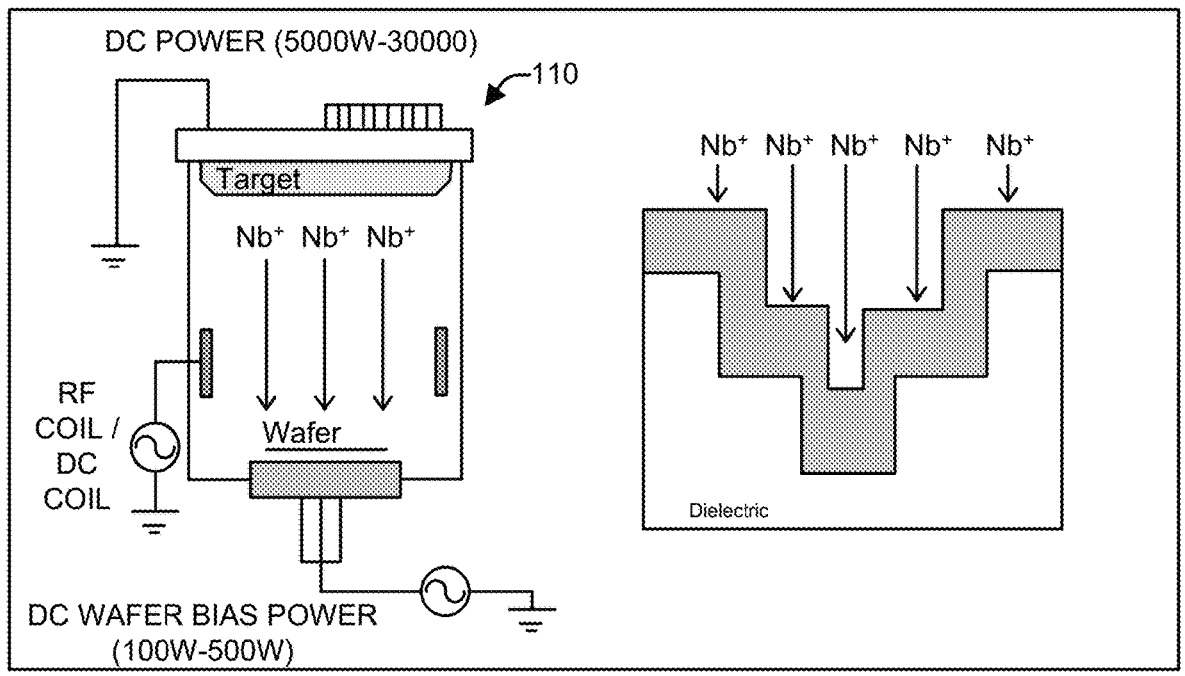
FIG. 8 illustrates a cross-sectional view of the deposition chamber during the deposition process showing the deposition of niobium ions onto the surface of the superconductor structure.
FIG. 9 illustrates a zoomed in cross-sectional view of the via and trench opening, and the deposition process showing the deposition of niobium ions onto the surface of the superconductor structure.

As shown in FIG. 8, the structure is moved to a deposition chamber 110. The deposition chamber 110 is setup with a slab of target material, such as niobium (Nb), disposed on a top surface of the chamber 110, and a wafer disposed on a temperature controlled chuck. To control the wafer temperature, an electrostatic chuck (ESC), which uses conductance to transfer heat to and from the wafer controlled between about 15° C. to about 150° C. (e.g., at or below 90° C.), provides repeatable results and tighter specifications of the film properties. A DC bias (5-30 KW) is applied to the slab of superconducting material and an AC Bias (100-500 W) is applied to the wafer on the chuck. An AC/DC coil is located around the periphery of the substrate and the coil power (DC power (0-500 W) and AC bias power (0-1500 W)) changes the amount of angular ionization which ionizes metal neutrals projected to the substrate with an angle between 45°-90°.

Argon is injected into the chamber, which bombards the slab causing Nb ions to be directed to the structure 50, and thus deposition of the Nb ions into vias and trench openings. The RF Coil/DC Coil provides directionality of the Nb ions based on a desired angular ionization. FIG. 9 illustrates a zoomed in view of the via and trench opening being filled with Nb ions to result in the deposition of a superconducting Nb material layer filling the via and trenches and covering the overlying second dielectric layer.

As previously stated, the formation of the superconducting lines and vias undergo a series of deposition and cooling steps to not allow overheating of the structure 50 above 150° C. This is achieved by depositing the metal film, turning off the power and allowing the wafer to cool before the next deposition cycle occurs. This is repeated until the metal film is deposited to the appropriate thickness. It has been discovered that the various parameters can be altered to promote better damascene fill which impacts superconducting properties. These include but are not limited to DC power (5-30 KW) applied to the target material, bias power (100-500 W) applied to the wafer, DC power (0-500 W) and RF power (0-1500 W) to coils to assist in deposition directionality, and base vacuum and pressure selection during deposition.

Figure 10:
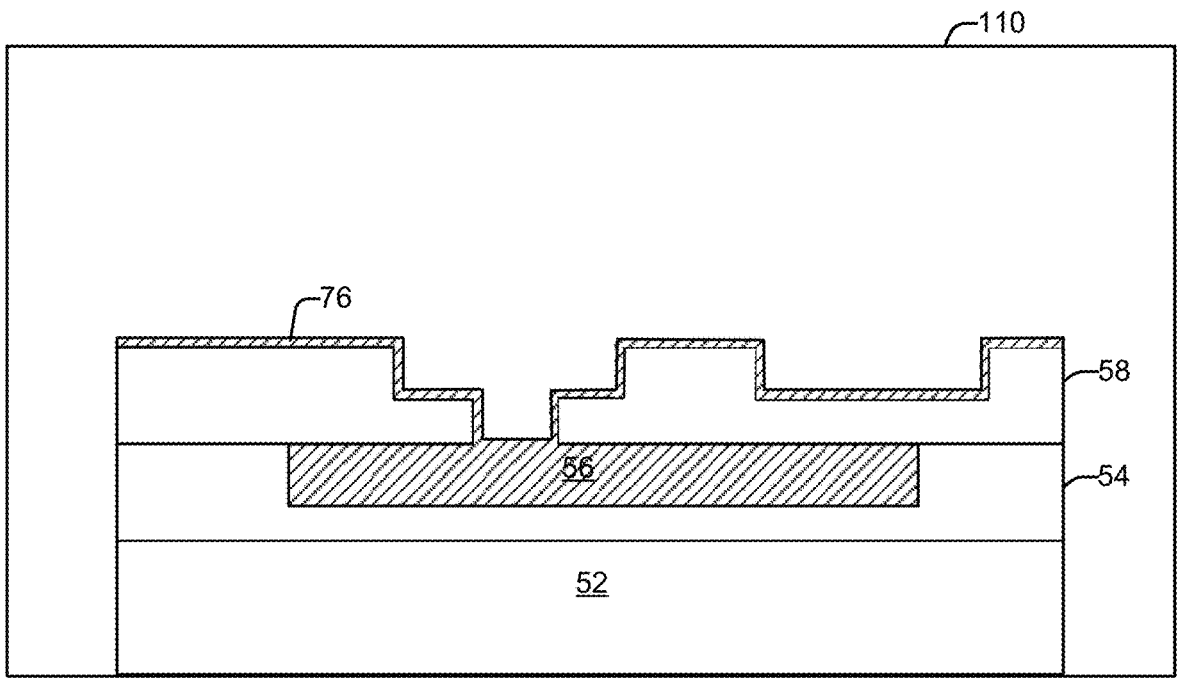
FIG. 10 illustrates a schematic cross-sectional view of the structure of FIG. 7 after undergoing deposition of a superconductor liner in the deposition chamber.

In the demonstrated process, the initial deposition deposits a metal such as Nb as a liner, which is very conformal to the damascene structure as illustrated in FIG. 10. The liner is deposited to allow a thin coating (10-25 nm) conformal metal film that allows successive metal depositions to form preferential grain structure which enable the metal film to fill the damascene structure.

One example for depositing a first layer or liner of superconducting material is as follows. First, the chuck is set and maintained at a temperature of about 75° C. to about 100° C. (e.g., 90° C.). Next, when the wafers enters the chamber and is clamped on the ESC chuck an Argon gas is flowed to the backside of the wafer through a gas line in the ESC at about 5 to about 6 standard cubic centimeters (sccm) to allow for heat transfer through conductance. Heat transfer to or from the wafer helps control the temperature of the wafer during processing. The chamber is then front-filled with about 5 to about 90 sccm (e.g., 83 sccm) of Argon, the processing gas. Next, DC power is applied to the slab of about 500 Watts for about 2 seconds to initiate the plasma process. The DC power is increased to about 20,000 Watts, the wafer AC bias power is set to about 100 to about 500 watts, while the RF Coil power is increased to about 1100 Watts causing the superconducting material to be deposited in the via and trench opening for about 20 to 40 seconds. Next a cooling step is performed by turning off the DC power, AC bias power, and coil power for about 40 to 200 seconds, depending on how long it takes for the wafer to cool back down to initial set temperature.

Figure 11:
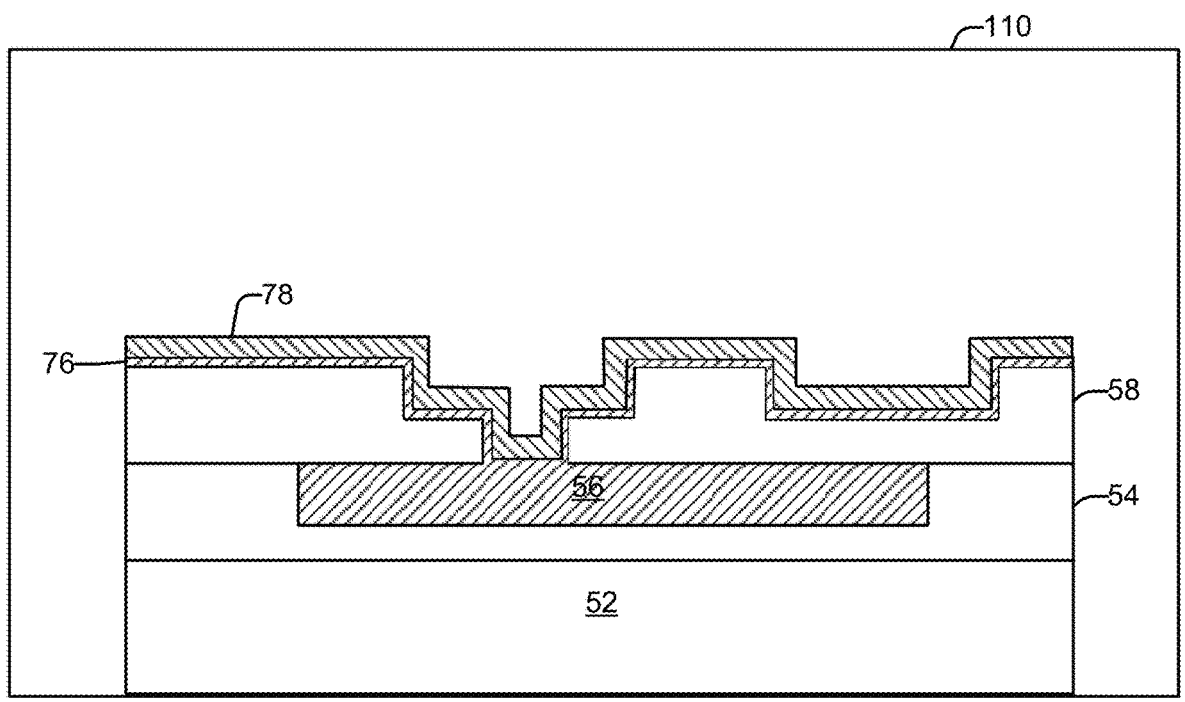
FIG. 11 illustrates a schematic cross-sectional view of the structure of FIG. 10 after a contact material fill to deposit a number of subsequent intermediate superconducting material layers in the deposition chamber.
Figure 12:
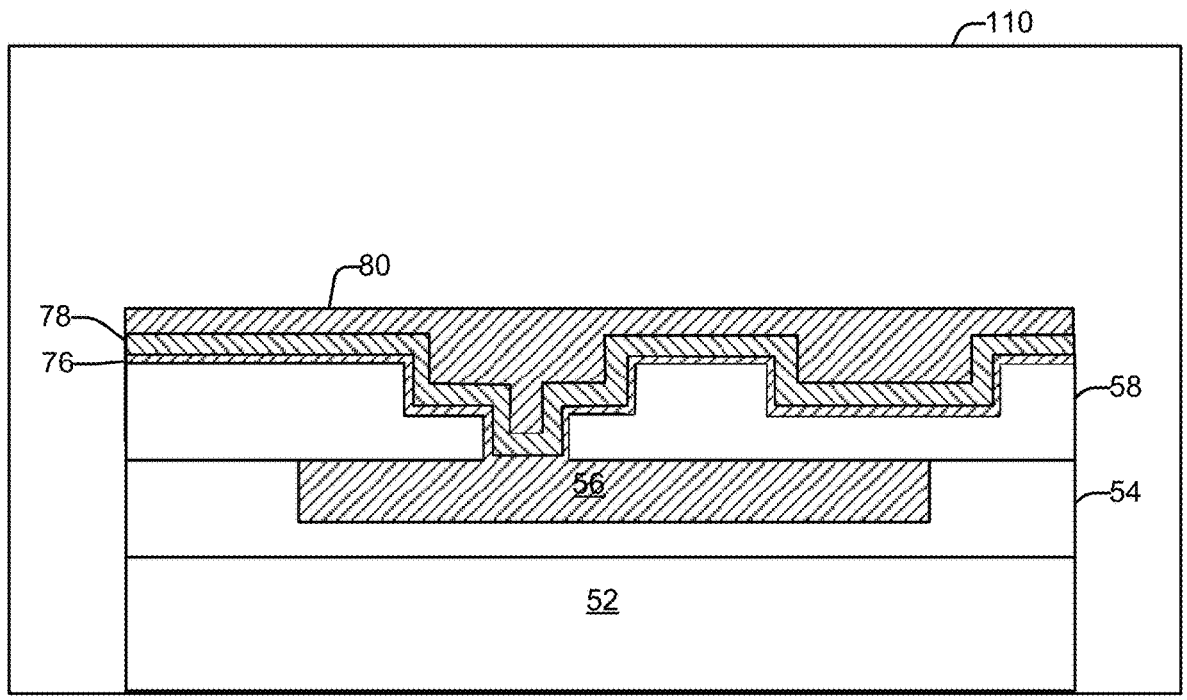
FIG. 12 illustrates a schematic cross-sectional view of the structure of FIG. 11 after a contact material fill to deposit a number of final intermediate superconducting material layers in the deposition chamber.

A number of subsequent intermediate superconducting material layers 78 are then deposited over the superconducting liner 76 to provide the resultant structure shown in FIG. 11. Furthermore, a number of subsequent final superconducting layers 80 are deposited over the intermediate superconducting material layers 78 to form the resultant structure of FIG. 12.

Each time an additional superconducting layer is deposited, the sequence is repeated of applying DC power to the slab of about 500 Watts for about 2 seconds to initiate the plasma process, increasing the DC power to about 20,000 Watts, AC bias power to about 100 to about 500 Watts, while the RF Coil power is increased to about 1100 Watts causing the superconducting material to be deposited in the via and trench openings for about 20 to 40 seconds, and repeating a cooling step by removing the DC power, AC bias power, and coil power for about 40 to 200 seconds. After the final layer is deposited, a final cooling step is performed for about 10 to 60 seconds, and a pumping process is performed to clear the Argon from the deposition chamber and remove the pressure from the chamber which takes about 5 seconds.

Figure 13:
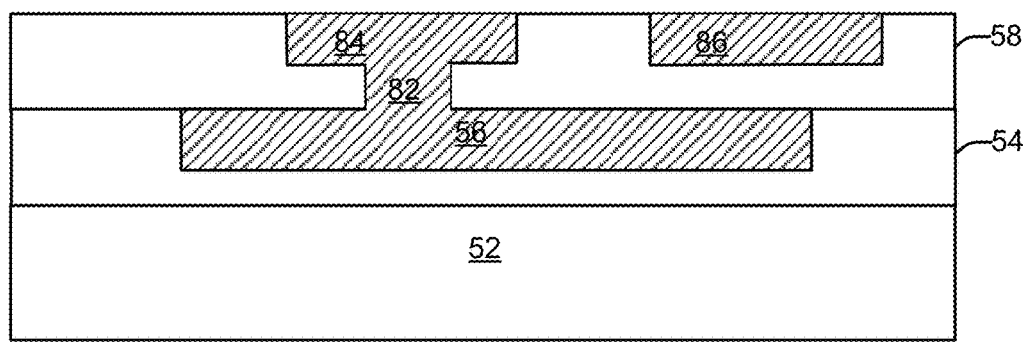
FIG. 13 illustrates a schematic cross-sectional view of the structure of FIG. 12 after undergoing a chemical mechanical polish.

Following deposition of the final layer of the contact material fill, the structure is removed from the deposition chamber 110, and is polished via chemical mechanical polishing (CMP) down to the surface level of the dielectric layer 58 to form a first contact 82, a second conductive line 84, and a third conductive line 86 to provide the resultant structure of FIG. 13.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor interconnect structure, the method comprising:

forming a dielectric layer overlying a substrate;
forming an interconnect opening in the dielectric layer;
moving the substrate to a deposition chamber; and
depositing a superconducting metal in the interconnect opening, by applying DC power to a slab of superconducting target material and applying an AC bias to the wafer to project ionized metal at an angle in the range of greater than 45 degrees and less than 90 degrees to the substrate and by performing a series of superconducting deposition and cooling processes to maintain a chamber temperature at or below a predetermined temperature until the superconducting metal has a desired thickness, to form a superconducting element in the superconductor interconnect structure, wherein the DC power applied to the slab of superconducting target material is set to be high enough to sputter target material onto the dielectric layer and into the interconnect opening the the AC bias applied to the wafer is set to be low enough to provide directionality to the ionized metal.

2. The method of claim 1, wherein the predetermined temperature is at or below 150° C.

3. The method of claim 1, wherein the superconducting metal is deposited from a target slab superconducting material residing in the deposition chamber.

4. The method of claim 3, wherein the depositing a superconducting metal comprises:
injecting Argon (AR) into the deposition chamber;
setting DC power applied to the slab of superconducting target material to about 5000 Watts to about 30000 Watts; and
setting AC bias applied to the wafer to be about 100 Watts to about 500 Watts.

5. The method of claim 4, further comprising setting the coil to have an RF power of about 1500 Watts, and DC power of about 500 Watts.

6. The method of claim 4, further comprising setting a backside wafer pressure to be greater than 4 Torr during deposition.

7. The method of claim 4, further comprising back-filling the argon gas into the chamber to about 5 to about 6 standard cubic centimeters (sccm) prior to deposition and front-filling the argon gas to into the chamber to about 5 sccm to about 90 sccm during deposition.

8. The method of claim 1, wherein the dielectric layer is a second dielectric layer that overlays a first dielectric layer having a first conductive line, and the interconnect opening is a dual damascene structure, such that the superconductor interconnect element is both a second conductive line and a contact that connects the first conductive line to the second conductive line through the second dielectric layer.

9. The method of claim 1, wherein the superconductor interconnect structure is part of a wafer that resides on a temperature control chuck during depositing of the superconducting metal, the temperature controlled chuck being set at a temperature at or below the predetermined temperature.

10. The method of claim 1, further comprising performing a sputter etch cleaning process on the top surface of the dielectric layer and in the interconnect opening prior to deposition.

11. The method of claim 1, further comprising performing a chemical mechanical polish (CMP) to align a top surface of the superconductor interconnect element with a top surface of the first dielectric layer.

12. A method of forming a superconductor dual damascene structure on a wafer, the method comprising:
forming a second dielectric layer over a first dielectric layer having a first superconducting element;
etching a contact opening in the second dielectric layer that extends to and exposes the first superconducting element in the first dielectric layer;
etching a conductive line opening in the second dielectric layer that overlies the contact opening to form a dual damascene structure having a dual damascene opening;
moving the dual damascene structure to reside on a temperature control chuck in a deposition chamber;
setting the temperature to the temperature controlled chuck in a range from 75° C. to 100° C.; and
depositing a superconducting metal in the dual damascene opening while in the deposition chamber to form a dual damascene structure comprised of a contact and a second conductive line overlying and coupled to the contact, such that the contact connects the first conductive line to the second conductive line through the second dielectric layer, depositing the superconducting metal comprises:
injecting Argon (Ar) into the deposition chamber;
setting the DC power aplied to the slab of superconducting target material to about 500 Watts for a predetermined time period;
increasing the power applied to the slab of superconducting target material to about 20,000 Watts;
setting the AC bias applied to the dual damascene structure in a range from about 100 Watts to about 500 Watts;
setting a coil to have an RF power of about 1100 Watts and DC power of about 500 Watts; and
performing a series of superconducting deposition processes for about 20 to 40 seconds and cooling processes for about 40 to 200 seconds to maintain a chamber temperature at or below the predetermined temperature until the superconducting metal has a desired thickness, wherein the DC power applied to the slab of superconducting target material is set be high enough to sputter target material onto the second dielectric layer and into the dual damascene opening and the AC bias applied to the wafer is set to be low enough to provide a linear directionality to the ionized metal.

13. The method of claim 12, wherein the dual damascene structure is formed from niobium that resides as a target slab material coupled to the deposition chamber.

14. The method of claim 12, wherein the predetermined temperature is at or below 90° C.

15. The method of claim 12, further comprising setting a backside wafer pressure to be greater than 4 Torr during deposition.

16. The method of claim 15, further comprising flowing the argon gas onto the backside of the wafer to about 5 to about 6 standard cubic centimeters (sccm) prior to deposition and front-filling the argon gas to into the chamber to about 5 sccm to about 90 sccm during deposition.

17. The method of claim 12, further comprising performing a sputter etch cleaning process on the top surface of the second dielectric layer and in the dual damascene opening prior to deposition.

18. The method of claim 12, further comprising performing a chemical mechanical polish (CMP) to align a top surface of the dual damascene structure with a top surface of the second dielectric layer.

* * * * *